US011323026B2

(12) United States Patent
Oshita et al.

(10) Patent No.: US 11,323,026 B2
(45) Date of Patent: May 3, 2022

(54) HYBRID DIGITAL LINEAR AND SWITCHED CAPACITOR VOLTAGE REGULATOR

(71) Applicant: Intel Corporation, Santa Clara, CA (US)

(72) Inventors: Takao Oshita, Portland, OR (US); Fabrice Paillet, Portland, OR (US); Rinkle Jain, Portland, OR (US); Jad Rizk, Portland, OR (US); Danny Bronstein, Haifa (IL); Ahmad Arnaot, Acre (IL)

(73) Assignee: Intel Corporation, Santa Clara, CA (US)

( * ) Notice: Subject to any disclaimer, the term of this patent is extended or adjusted under 35 U.S.C. 154(b) by 196 days.

(21) Appl. No.: 16/563,495

(22) Filed: Sep. 6, 2019

(65) Prior Publication Data

US 2021/0075316 A1    Mar. 11, 2021

(51) Int. Cl.
*H02M 3/07*         (2006.01)
*H02M 1/00*         (2006.01)
(Continued)

(52) U.S. Cl.
CPC ............ *H02M 3/07* (2013.01); *G06F 1/3234* (2013.01); *H02M 1/00* (2013.01); *H03K 5/249* (2013.01);
(Continued)

(58) Field of Classification Search
None
See application file for complete search history.

(56) References Cited

U.S. PATENT DOCUMENTS 6,636,023 B1 * 10/2003 Amin ........................ G05F 1/56
                                                          323/268
9,651,961 B2 * 5/2017 Muthukaruppan ..... H02M 3/07
(Continued)

FOREIGN PATENT DOCUMENTS

KR             101902119           11/2018

OTHER PUBLICATIONS

International Search Report and Written Opinion from PCT/US2020/045274 dated Nov. 17, 2020, 12 pgs.
Chang, Leland et al., "A Fully-Integrated Switched-Capacitor 2:1 Voltage Converter with Regulation Capability and 90% Efficiency at 2.3A/mm$^2$", 2010 Symposium on VLSI Circuits/Technical Digest of Technical Papers, 2 pgs.
(Continued)

*Primary Examiner* — Jeffery S Zweizig
(74) *Attorney, Agent, or Firm* — Schwabe, Williamson & Wyatt, P.C.

(57) ABSTRACT

An on-die voltage regulator (VR) is provided that can deliver much higher conversion efficiency than the traditional solution (e.g., FIVR, LDO) during the standby mode of a system-on-chip (SOC), and it can save the power consumption significantly, during the connected standby mode. The VR operates as a switched capacitor VR under the low load current condition that is common during the standby mode of the SOC, while it automatically switches to the digital linear VR operation to handle a sudden high load current condition at the exit from the standby condition. A digital proportional-integral-derivative (PID) controller or a digital proportional-derivative-averaging (PDA) controller is used to achieve a very low power operation with stability and robustness. As such, the hybrid VR achieves much higher conversion efficiency than the linear voltage regulator (LVR) for low load current condition (e.g., lower than 500 mA).

15 Claims, 14 Drawing Sheets

(51) Int. Cl.
  *G06F 1/3234* (2019.01)
  *H03K 5/24* (2006.01)
(52) U.S. Cl.
  CPC ........ *H02M 1/0012* (2021.05); *H02M 1/0045* (2021.05)

(56) References Cited

U.S. PATENT DOCUMENTS

| | | | |
|---|---|---|---|
| 2005/0036245 A1* | 2/2005 | Greenfeld | H02M 3/3376 |
| | | | 361/18 |
| 2008/0129573 A1 | 6/2008 | Mueck et al. | |
| 2012/0032722 A1 | 2/2012 | Mulder | |
| 2014/0344589 A1 | 11/2014 | Muthukaruppan et al. | |
| 2018/0287572 A1 | 10/2018 | Oishi | |

OTHER PUBLICATIONS

Le, Hanh-Phuc et al., "A Sub-ns Response Fully Integrated Battery-Connected Switched-Capacitor Voltage Regulator Delivering 0.19W/mm$^2$ at 73% Efficiency", ISCC 2013, Session 21, Power Converters, 21.6, 3 pgs.

Ramadass, Yogesh K., "A Fully-Integrated Switched-Capacitor Step-Down DC-DC Converter With Digital Capacitance Modulation in 45 nm CMOS", IEEE Journal of Solid-State Circuits, vol. 45, No. 12, Dec. 2010, 9 pgs.

Seeman, Michael D. et al., "Analysis and Optimization of Switched-Capacitor DC-DC Converters", IEEE Transactions on Power Electronics, vol. 23, No. 2, Mar. 2008, 11 pgs.

* cited by examiner

HYBRID DIGITAL LINEAR AND SWITCHED CAPACITOR VOLTAGE REGULATOR

BACKGROUND

A switched-capacitor (SC) voltage regulator (VR) is a type of DC-DC converter that is known to deliver a good power conversion efficiency for a light load current among converter architectures, but it is not widely used as a fully integrated solution of system-on-chip (SOC) due to its high cost in product context. A number of fly capacitors in the SC VR determines the highest load current that a SC VR can deliver. Thus, for an SC VR to provide high load current, many switching capacitors, such as metal-insulator-metal (MIM) capacitors, are desired. SOC also demands MIM capacitors for voltage droop suppression of many other power rails, which creates a resource conflict. Further, traditional on-die linear voltage regulator (LVR) solution can achieve limited conversion efficiency (e.g., 56.7%) when the power supply is converted from 1.8 V to 1.02 V, for example. This limited efficiency results in power loss.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
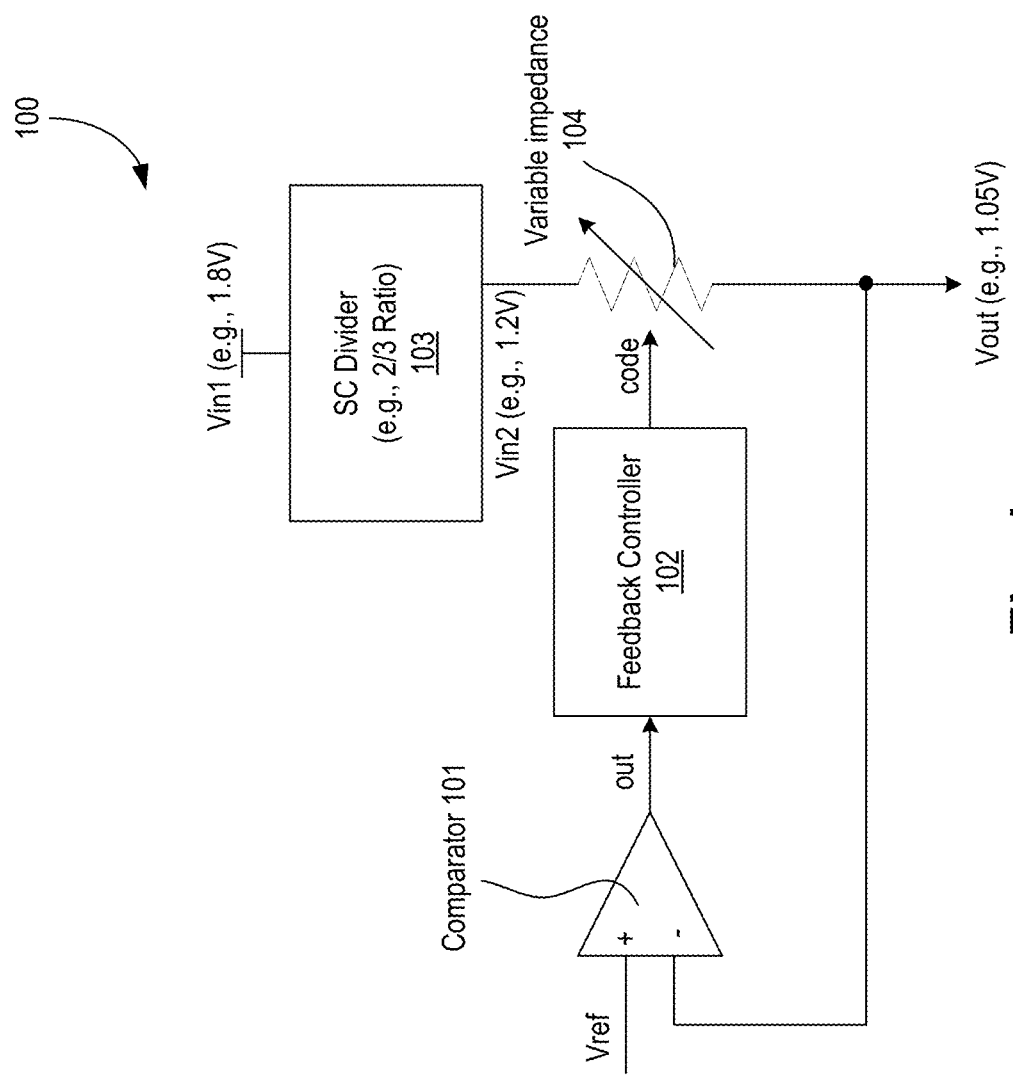
FIG. 1 illustrates a conceptual mechanism of switched capacitor voltage regulator (SCVR) in accordance with some embodiments.

Fully integrated on-die Buck converter (FIVR) can achieve higher efficiency, (e.g., 80 to 90% of the conversion efficiency) only if the load current is high enough (e.g., greater than 500 mA), but it cannot achieve a high conversion efficiency for low load current condition. Here, conversion efficiency refers to converting input power to output power.

Some embodiments describe an on-die voltage regulator (VR) that can deliver much higher conversion efficiency than the traditional solution (e.g., FIVR, and low dropout (LDO) regulator) during the standby mode of the SOC, and it can save the power consumption significantly, during the connected standby mode. Connected standby is a mode of operation in which a device can remain in a low-powered, idle condition but can still be transitioned immediately to a fully operational state. Some embodiments, describe a hybrid on-die digital linear/switched capacitor voltage regulator (VR) that operates as a switched capacitor VR under the low load current condition that is common during the standby mode of SOC, while it automatically switches to the digital linear VR operation to handle a sudden high load current condition at the exit from the standby condition. In some embodiments, the hybrid VR deploys a digital proportional-integral-derivative (PID) or digital proportional-averaging-derivative (PDA) controller to achieve a very low power operation with stability and robustness.

There are many technical effects of the various embodiments. For example, the hybrid VR achieves much higher conversion efficiency than a linear voltage regulator (LVR) for low load current condition (e.g., lower than 500 mA). Here, low load current condition generally refers to a current level expected in an almost idle operational state such as standby mode or connected standby mode of an SOC. The hybrid VR of various embodiments achieves higher conversion efficiency than the fully integrated buck converter solution (FIVR) for a low load current condition. As mentioned above, FIVR is unable to deliver good efficiency (e.g., 80% or higher) if the load current is lower than 500 mA. The hybrid SC VR can manage and handle high load current demands with the same number of capacitors (e.g., fly capacitors) as in a traditional SC VR.

During the standby condition of SOC, average load current is very low most of the time, but it can face a sudden high load current condition occasionally, for example, at the exit from the stand-by condition. For a switched capacitor VR, the maximum current capability is limited by the size of the capacitor, and in general, the traditional switched capacitor VR cannot support a sudden high load current due to the limited capacitor size. The hybrid VR of various embodiments has a capability to operate as a digital linear regulator, where the VR gets into a linear digital VR mode automatically, so that the hybrid VR can handle a sudden high load current that can happen occasionally, even during the standby condition. Additional advantages of the hybrid VR of some embodiments are that it does not directly use off-die components that are used in a traditional FIVR, and also may not need calibration for high volume manufacturing (HVM). As such, the hybrid VR also reduces the cost of bring a product to market.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a conceptual mechanism of switched capacitor voltage regulator (SCVR) 100, in accordance with some embodiments. SCVR includes comparator 101, feedback controller 102, switch-capacitor (SC) divider 103, and variable impedance 104 coupled as shown. Comparator 101 compares the output voltage Vout (on node Vout) with a reference voltage Vref (at node Vref) and generates an output out (on node out) that indicates whether the voltage on Vout is higher or lower than Vref. Feedback controller 102 may include an up/down counter and depending on the logic level of output out, it increases the value of a code or decreases the value of the code. The digital code is received by a variable impedance block 104, which increases or decreases its impedance depending on the value of the code. As such, voltage on node Vout is regulated, where Vin2 is the input voltage to the variable impedance block 104.

Here, switched capacitor divider 103 is a circuit that comprises MIM fly capacitors and MOS switches. In this example, the switched capacitor divider down-converts 1.8 V input on node Vin1 to 1.2 V on node Vin2 with a minimal efficiency loss. After the voltage conversion to 1.2 V, the resistive component 104 further down-converts towards a target output voltage of 1.05 V on node Vout. Controller 102 controls the resistance of this resistive component 104 to achieve the target output voltage on node Vout. As a part of the regulation circuit, comparator 101 compares the output voltage with the target voltage Vref, while feedback controller 102 adjusts the resistance of block 104 based on the comparator output out. For example, if the output voltage Vout is higher than the target voltage Vref, controller 102 increases the resistance 104 to cause higher IR voltage drop and move the output voltage lower, while if the output voltage Vout is lower than the target voltage Vref, controller 102 reduces the resistance to lower the IR drop to move the output voltage higher.

Figure 2:
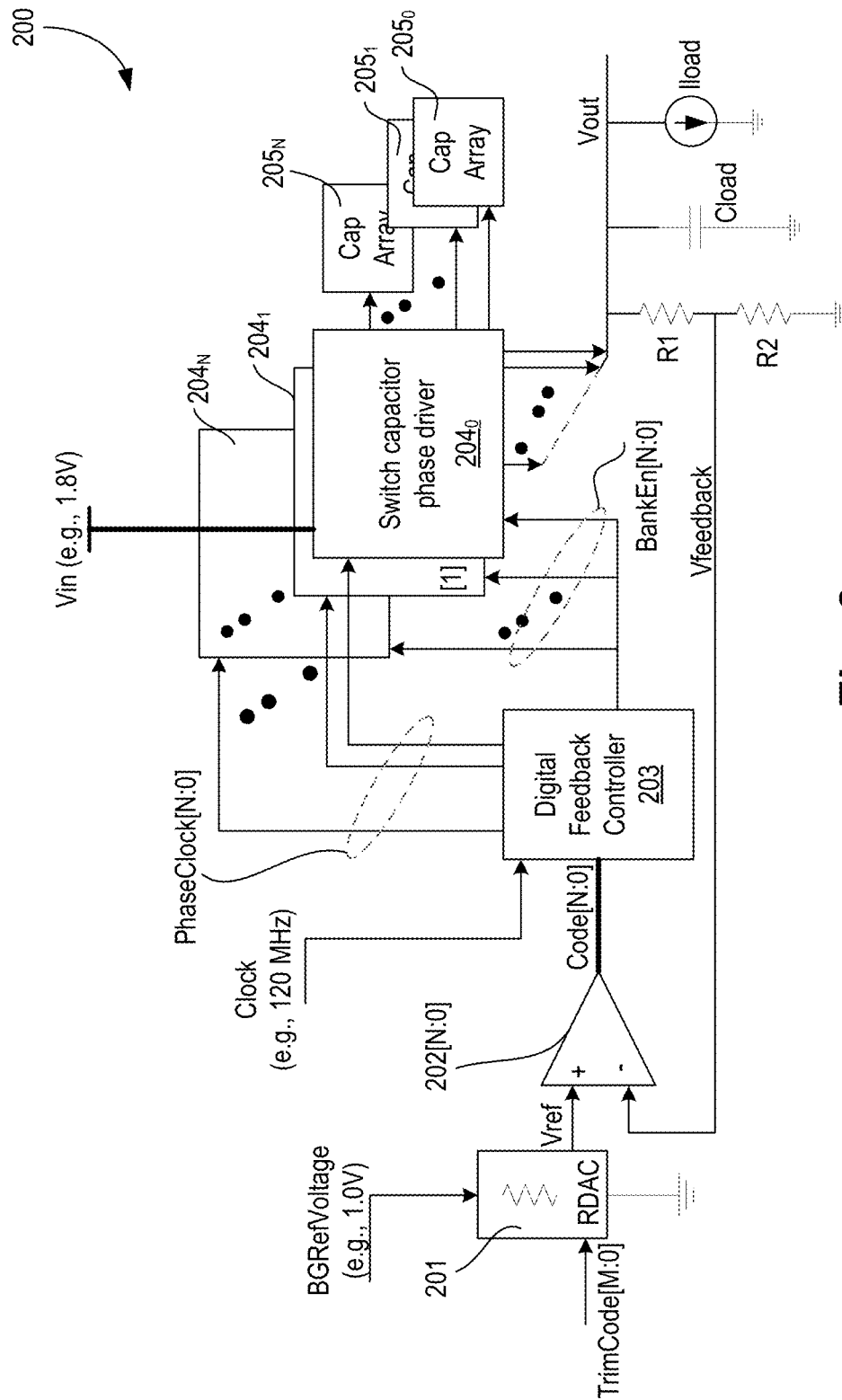
FIG. 2 illustrates a hybrid digital linear SCVR, in accordance with some embodiments.

FIG. 2 illustrates hybrid digital linear SCVR 200, in accordance with some embodiments. SCVR 200 comprises reference generator 201, a plurality of PID or PDA comparator circuitries $202_0$ to $202_N$ (where N is an integer), digital feedback controller 203, a plurality of switch capacitor phase drivers $204_0$ to $204_N$ (where N is an integer), capacitor array $205_0$ to $205_N$, voltage divider comprising resistors R1 and R2, and load capacitor Cload. The output node Vout is coupled to a load (modeled as a current sink). The load can be any suitable load such as processor core, cache, graphics unit, I/O, etc.

In some embodiments, reference generator 201 comprises a digital-to-analog converter (DAC) that receives an M-bit digital code TrimCode[M:0], where M is an integer and generates a corresponding reference voltage Vref. A DAC is an apparatus that converts digital data (e.g., binary or thermometer coded) into an analog signal (current, voltage, or electric charge). In some embodiments, DAC 201 is a pulse width modulator DAC. In other embodiments, other types of DACs may be used for implementing DAC 201. For example, interpolating DAC (also known as oversampling DAC), binary weighted DAC (e.g., switched resistor DAC, switched capacitor DAC, switched current-source DAC), R-2R ladder DAC, thermometer coded DAC, segmented DAC, etc. may be used for implementing DAC 201. In this example, DAC 201 is a resistor DAC (RDAC) which generates various voltage levels of Vref according to the M-bit TrimCode and input reference such as band-gap reference voltage (e.g., BGRefVoltage of 1.0V). For example, the reference voltage BGRefVoltage from a band-gap reference circuit feeds into RDAC 201, and RDAC 201 trims the reference voltage BGRefVoltage to adjust the target output voltage Vref.

Figure 4:
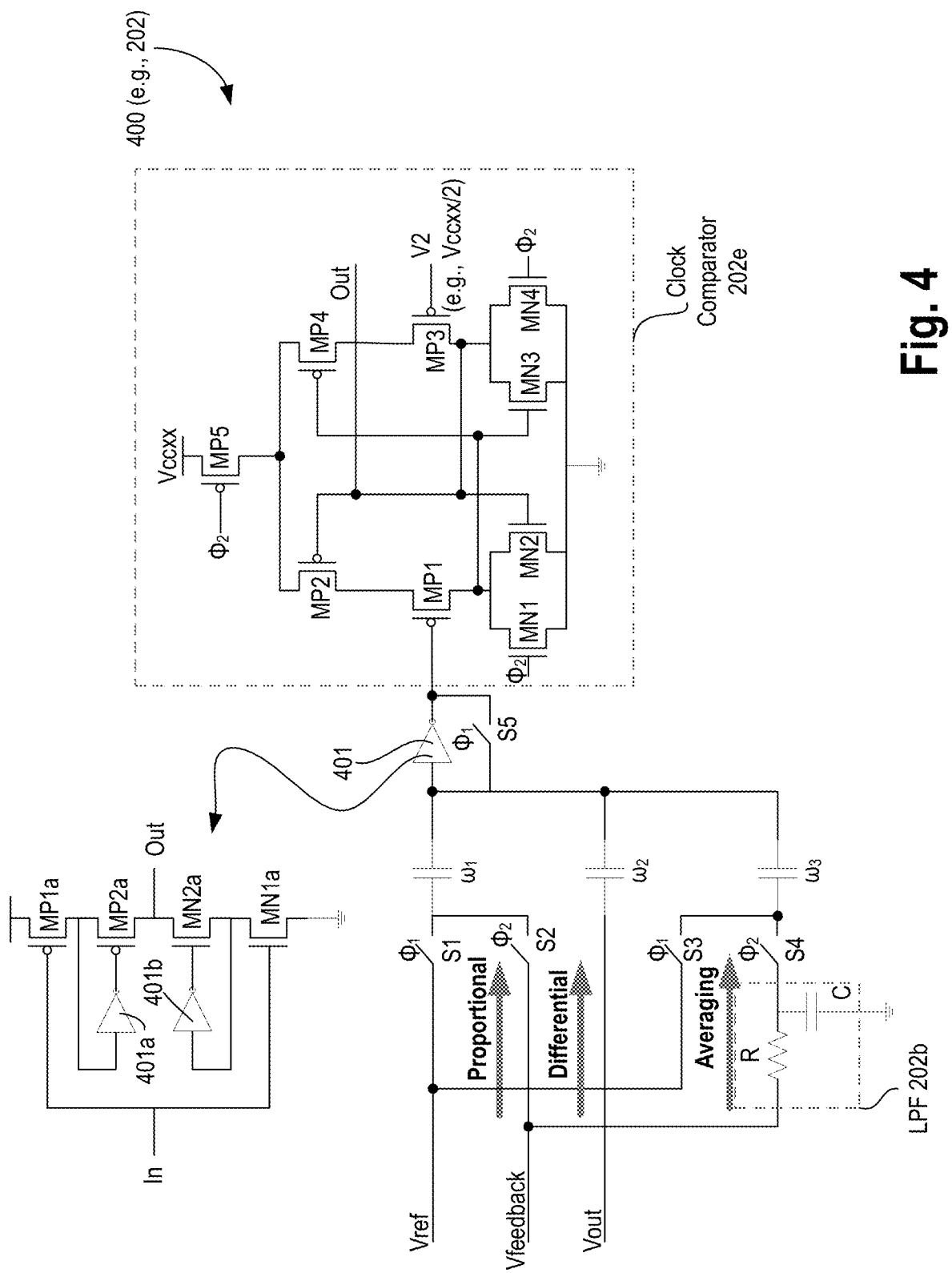
FIG. 4 illustrates a comparator circuitry for the hybrid digital linear SCVR, in accordance with some embodiments.

In some embodiments, comparator 202 (e.g., comparator $202_0$) compares the voltage on node Vref with a feedback voltage Vfeedback. In some embodiments, comparator 202 comprises three independent comparators. The primary comparator is logically a single comparator that can sample the input for every cycle, and comprises two independent physical comparators in parallel, which are interleaved with each other, each of which can sample the input voltage once every two cycles. In various embodiments, comparator 202 receives three inputs, the reference voltage Vref from RDAC 201, the divided output voltage Vfeedback, and an output voltage of VR Vout, and produces a binary output (0 or 1) based on the comparison, and the result is sent to the digital feedback controller 203. Each comparator from among the N comparators $202_0$ to $202_N$ generates a binary output, which combines to form an N-bit Code (illustrated as Code[N:0]). Each comparator generates an output decision based on weighted sum of three terms: the proportional, the differential, and the average (or in some cases, integral) terms. FIG. 4 illustrates one such embodiment of comparator $202_0$.

Referring back to FIG. 2, Code[N:0] is sent to feedback controller 203. Feedback controller 203 takes an action to control the output voltage by selectively turning on or off one or more switch capacitor phase drivers $204_0$ though $204_N$. As such, resistance between Vin and Vout is controlled by changing the effective size of phase drivers $204_0$ though $204_N$. By turning on and off banks of phase drivers $204_0$ though $204_N$ using the N-bit bank enable code BankEn[N:0], where N is an integer, the effective size of the phase driver can be modified, and thus, it can increase or decrease the IR drop, and the output voltage Vout. Further refined voltage adjustment between Vin and Vout (via adjustment in resistance) can be achieved by modifying the N-bit phase clock PhaseClock[N:0] to phase drivers $204_0$ though $204_N$. The output from each switch capacitor phase drivers $204_0$ though $204_N$ is merged together to form output Vout. In various embodiments, capacitors 205 for each switch capacitor phase drivers $204_0$ though $204_N$ is implemented in any suitable configuration. For example, capacitors $205_0$ though $205_N$ can be implemented as MIM capacitors, a hybrid of transistors and metal capacitors, transistor capacitors, or metal capacitors. In some embodiments, the capacitors are configured in an array configuration such as K×L arrays, were K and L are integers.

Figure 3:
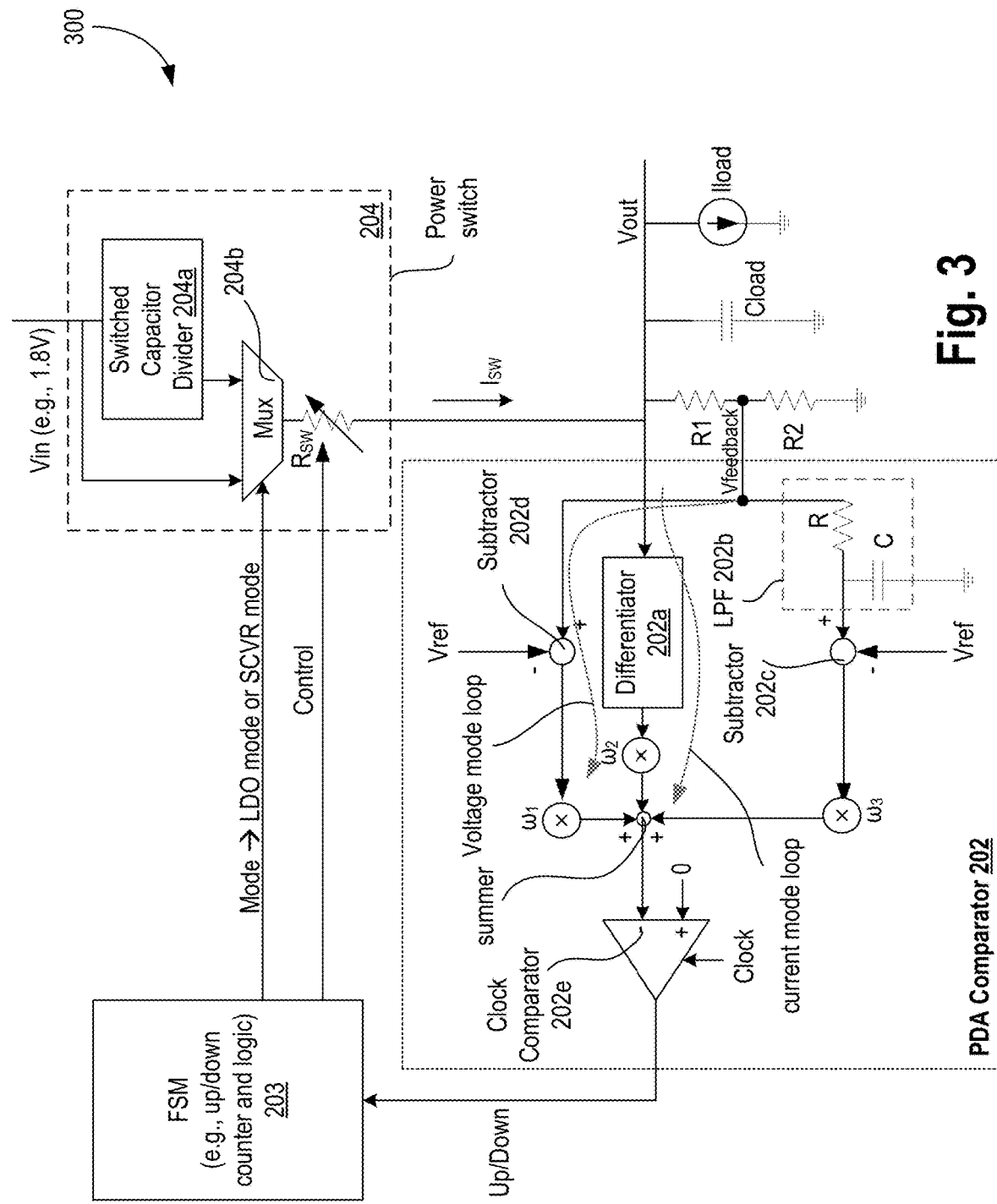
FIG. 3 illustrates a functional schematic of the two modes of operation of the hybrid SCVR, in accordance with some embodiments.

FIG. 3 illustrates a functional schematic 300 of the two modes of operation of the hybrid SCVR, in accordance with some embodiments. Schematic 300 shows more details of comparator 202 (e.g., proportional, differential, and averaging (PDA) comparator). Comparator 202 comprises differentiator 202a, low pass filter (LPF) 202b as averager, subtractor 202c, subtractor 202d, weights $\omega_1$, $\omega_2$, and $\omega_3$, summer node, and clocked comparator 202e. Here, each switch capacitor phase driver is modeled with a switch capacitor divider 204a, multiplexer (Mux) 204b, and variable resistor $R_{SW}$.

In various embodiments, FSM (finite state machine) 203 controls the effective impedance of power switch 204 via the control code. Mux 204b is used to select one of linear VR mode (e.g., low dropout (LDO) mode), or SCVR mode in accordance with the loading condition (e.g., amount of current draw Iload). In various embodiments, comparator 202 receives three inputs, the reference voltage Vref from RDAC 201, the divided output voltage Vfeedback, and an output voltage of VR Vout, and produces a binary output Up/Down (0 or 1) based on the comparison, and the result is sent to the digital feedback controller 203.

In various embodiments, PDA comparator 202 includes two separate operational loops—voltage mode loop and current mode loop. Typically, comparators used in the feedback system of a VR only has a voltage mode loop. Having two separate loops allows for faster response to di/dt (sudden change in current) events on the Vout node because the current mode loop allows for immediate and direct load current measurement via differentiator 202a. In typical comparators, that only have voltage mode loops, di/dt event is only detected after the voltage droop on Vout is significant.

Note, generally Cload is high (e.g., in the 500 nF range), and so detecting di/dt events just by a voltage mode loop is a slow process. The high Cload is not only because of dynamic capacitance of the load, but also because of decoupling capacitors between Vin and Cout, capacitor arrays 205 (e.g., MIM capacitor arrays), and package capacitors that are connected to the Vin or Vout power supply grid to suppress the voltage droop that is beyond the bandwidth of the VR. The large Cload hides the effect of a di/dt event. At a di/dt event, the output voltage of VR (Vout) starts shifting down gradually, and a voltage mode loop (of typical VRs) cannot distinguish di/dt event from a regular steady state ripple until the voltage droop becomes significant. This is because typical VRs do not measure current through the Vout node. In various embodiments, differentiator 202a detects a di/dt event on Vout immediately, and FSM 203 uses this information to control power switch 204. For example, differentiator computes Cload.d(Vout)/dt which is equal to a difference of switch current $I_{SW}$ and load current Iload. In some embodiments, capacitor with $\omega 2$ that samples Vout, indicated as "differential", samples Vout with clock phase $\phi 1$, and it samples Vout again with clock phase $\phi 2$. In some embodiments, there is no pass gate for sampling, because differentiator 202a does not switch to different node in different phases, but Vout is automatically sampled at each phase. The charge is injected to the capacitor ω2, which is proportional to the voltage delta of Vout for the first and second sampling.

The current mode loop of various embodiments provides a better control on voltage ripple on Vout than traditional VRs. Voltage ripple not only affects the power efficiency of the VR, but it can kill the chip operation, and as a result, it is important to functional operation of products. This control loop contains two poles. The primary pole is at the output Vout of VR, and the location of the pole can be written by the following equation in theory:

$$f_{pole1} = \frac{1}{2\pi R_{sw} C_{load}} \quad (1)$$

where $R_{sw}$ indicates the resistance of the power MOS switch 204, and $C_{load}$ indicates the load capacitance of VR. On the product context, $C_{load}$ is typically 500 nF, and $R_{sw}$ is determined by the load current. From equation (1), for a load current of 200 µA, the pole frequency ($f_{pole1}$) is in an order of 100 Hz, while, for a load current of 200 mA, the pole frequency ($f_{pole1}$) is in an order of 100 kHz. The second pole is at the output of the up/dn counter 203, which acts as an integrator circuit. The location of the second pole ($f_{pole2}$) is roughly in an order of $$\frac{f_{sample}}{2^{\#of\ bits\ in\ up/dn\ counter}},$$

where $f_{sampling}$ indicates the sampling frequency of clocked comparator 202e. The number of bits of up/dn counter is determined by the granularity of the switch resistance modulation (ΔR) and the range of the resistance modulation (max [R]–min [R]). $f_{pole2}$ is independent of the load current, and for sampling frequency of 50 MHz and 6 bit resolution of up/dn counter 203, $f_{pole2}$ is about 800 kHz.

Continuing with this example, for the low load current (200 µA), $f_{pole1}$ (=100 Hz) and $f_{pole2}$ (=800 kHz) are far away from each other, which can achieve high enough phase margin, while for a high load current (e.g., 200 mA), $f_{pole1}$ (=100 kHz) and $f_{pole2}$ (=800 kHz) are close together, which results in the poor phase margin. The voltage ripple is known to be a function of the phase margin, and poorer phase margin increases the voltage ripple. The current control loop improves this situation, significantly, in accordance with various embodiments. The current control loop creates a zero in the control loop, because the load current is derived by the differentiation of the output voltage, as indicated by the following equation:

$$I_{sw} - I_{load} = C_{load} \frac{dV_{out}}{dt} \quad (2)$$

where $C_{load}$ indicates the load capacitance of VR, $I_{load}$ is the load current, and $I_{sw}$ indicates the current through the power MOS switch 204. The location of the zero ($f_{zero}$) is near the second pole $f_{pole2}$ because the up/dn counter output and the current ($I_{sw}-I_{load}$) are sampled by the common clock with the frequency $f_{sampling}$. The zero at $f_{zero}$ cancels the effects of the second pole at $f_{pole2}$ which improves the phase margin, significantly, in accordance with various embodiments. In various embodiments, VR 300 achieves steady state when Vout is equal to a target, and when $I_{SW}$ is equal to Iload.

FIG. 4 illustrates comparator circuitry 400 (e.g., 202) for the hybrid digital linear SCVR, in accordance with some embodiments. Comparator 400 comprises switches (e.g., transistors) S1, S2, S2, and S4 controllable by clock phases $\Phi_1$, $\Phi_2$, $\Phi_1$, and $\Phi_2$, respectively. Comparator further comprises a gain boosting inverter amplifier 401 coupled to switch S5 controllable by clock phase $\Phi_1$ (first phase). Here, one example embodiment of a gain-boosting inverter amplifier is illustrated. In some embodiments, gain boosting inverter amplifier 401 comprises p-type transistors MP1a and MP2a, n-type transistors MN1a and MN2a, and inverters 401a and 401b, coupled as shown. In some embodiments, a simple inverter or an inverting amplifier replaces gain-boosting inverter 401.

Comparator 400 comprises a clocked comparison stage including p-type transistors MP1, MP2, MP3, MP4, and MP5; and n-type transistors MN1, MN2, MN3, MN4, and MN5 coupled as shown. Transistor MP5 is controllable by clock phase $\Phi_2$ (second phase). The gate of MP1 is controllable by the output of inverter 401. Transistor MN1 is controllable by clock phase $\Phi_2$. Transistor MN4 is controllable by clock phase $\Phi_2$. Transistor MP3 is controllable by voltage V2 (e.g., ½ of supply voltage Vccxx).

Here, the primary comparator is logically a single comparator that can sample the input for every cycle, and comprises two independent physical comparators in parallel, which are interleaved with each other, each of which can sample the input voltage once every two cycles. The comparator receives three inputs, the reference voltage Vref from RDAC 201, the divided output voltage Vfeedback, and the output voltage of VR Vout, and produces the binary output Out (0 or 1) based on the comparison. Comparator 400 sends the result Out to digital feedback controller 203.

Comparator 400 generates out based on the weighted sum of three terms, the proportional, the differential, and the averaging terms, in accordance with various embodiments. The weighted sum of proportional (P) component, differential (D) component, and averaging (A) component is received as input to the gain-boosting inverter 401. The input of the inverter 401 can be expressed as:

$$\omega_1 (V_{feedback} - V_{REF}) + \omega_2 \frac{dV_{out}}{dt} + \omega_3 \sum (V_{feedback} - V_{REF})$$

Here, the total weight is indicated by the ratio of capacitances associated with weights $\omega_1$, $\omega_2$, and $\omega_3$. Switched capacitor adder provides the summing and the weight of each term is determined by the ratio of the capacitors. The proportional term is the same as the regular voltage comparator, and it captures the voltage delta of two input signals (e.g., difference between Vref and Vfeedback). The differential term captures dVout/dt. Differentiation is achieved by capturing the output voltage Vout in one cycle earlier and the current cycle, and by subtraction by the switched capacitor subtractor. Note that i (current)=C (capacitance)*dVout/dt. As such, the differentiation term captures the load current Iload. The role of this term is to improve the phase margin and to reduce the voltage ripple, for example. The last term is the averaging term, which captures the voltage difference of the filtered versions of two input signals. The signal Vfeedback, which is one of the inputs into comparator 400, can contain AC noise. If the input contains the AC noise, that is the harmonics of the sampling frequency of the SCVR, then, the DC voltage may not converge to the target due to the aliasing effect. Low pass filtered version of VFeedback, via LPF 202*b*, helps the SCVR loop to converge Vout to the correct target in such case.

Traditional digital PID controller requires a full ADC (analog-to-digital converter) and a complicated digital filter, which consumes a lot of power and silicon area. The invented comparator, is different from the existing design, and it can achieve the PID control with a simple mechanism with minimal silicon area and a very low power (e.g., in an order of 50 µW). Further, comparator 400 has the capability for auto-zero, and as a result, no calibration is required.

Here, two auxiliary comparators are used. One comparator is used to detect the voltage at the target voltage plus offset, and the other comparator is used to detect the voltage at the target voltage minus offset. These offsets can be programmable through fuse override, resisters, or operating system. In one example, the faults setting of the offsets is about 50 mV. Each auxiliary comparator produces the binary output (0 or 1), and it is sent to digital feedback controller 203.

The output of inverter 401 is received by clock comparator 202*e*. Any suitable clock comparator can be used to implement circuitry 202*e*. Circuitry 202*e* compares the gate voltage of MP1 with the gate voltage (V2) of MP3, and generates 0 or 1 output "Out" based on the comparison. The functionality is the same as a static comparator but with known comparison time. A person skilled in the art would appreciate that for a static comparator, the time that is needed for comparison is not known, and during the comparison, the comparator output can be in meta-stable state. For clocked comparator 202*e*, a decision is made within one clock cycle without the output of the comparator becoming meta-stable.

Figure 5:
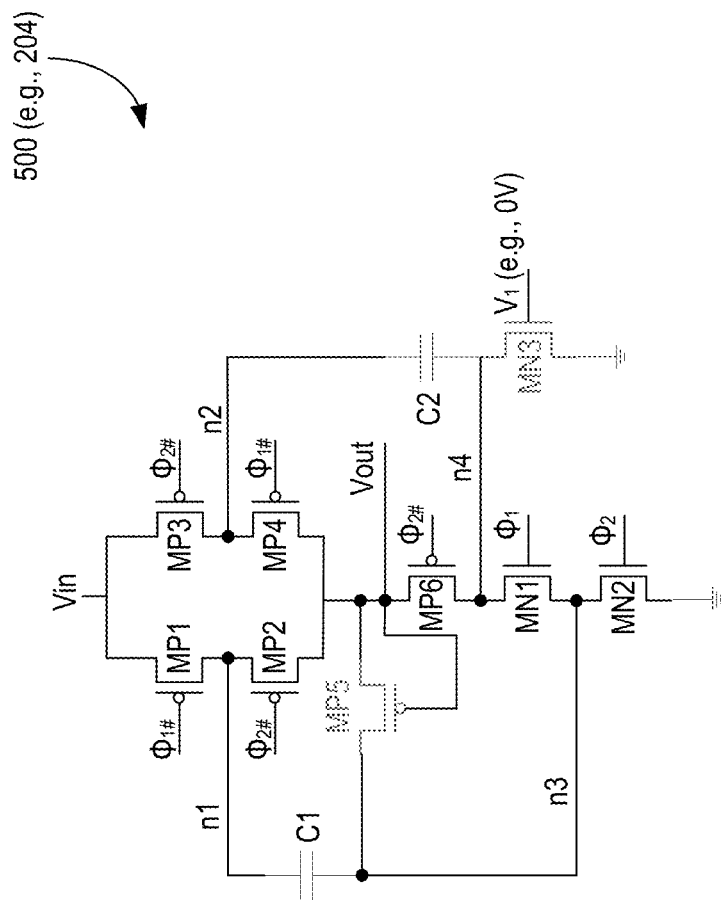
FIG. 5 illustrates a switched capacitor divider circuitry with 3:2 divider ratio, in accordance with some embodiments.
Figure 6:
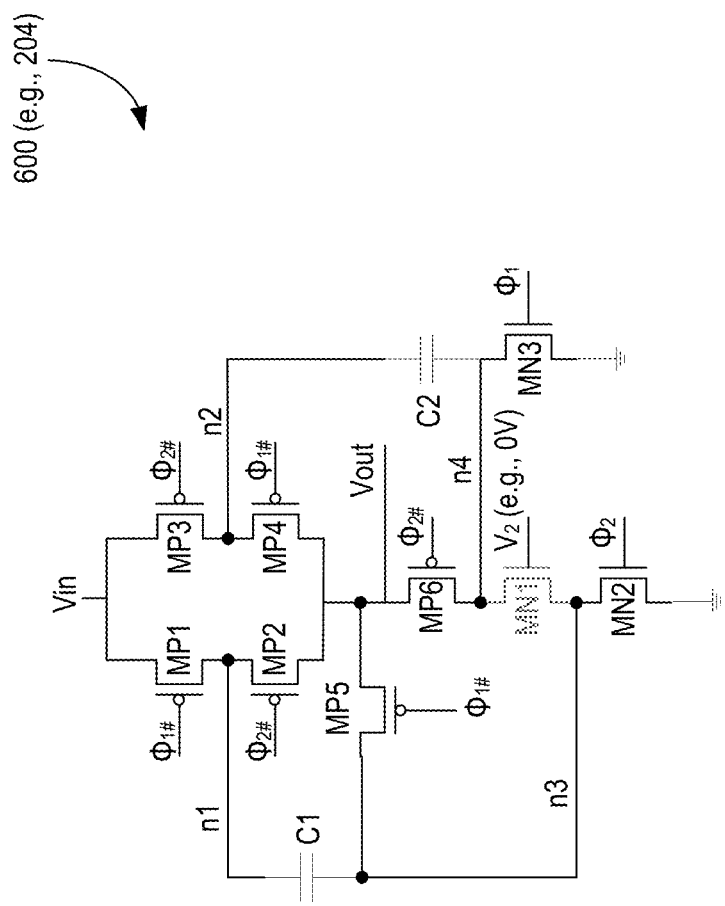
FIG. 6 illustrates a switched capacitor divider circuitry with 1:2 divider ratio, in accordance with some embodiments.
Figure 7:
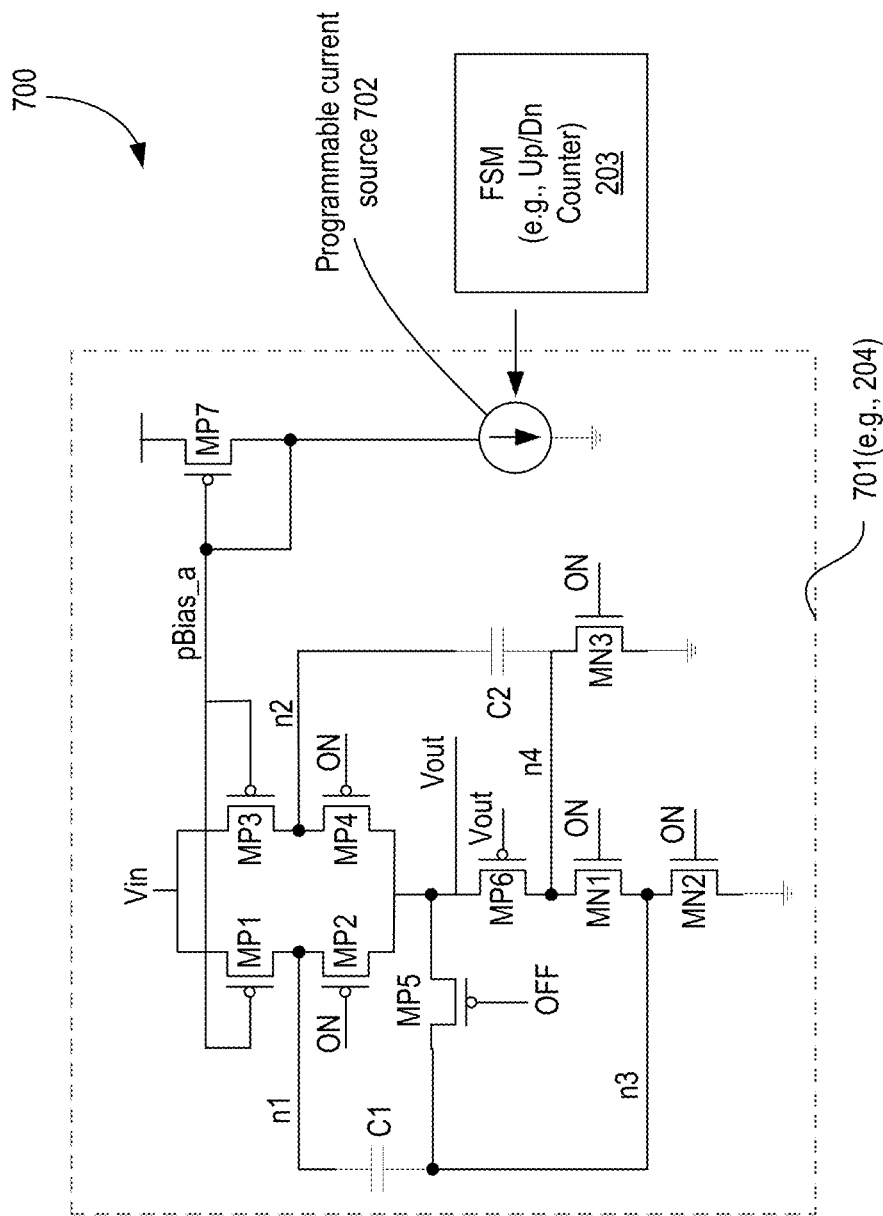
FIG. 7 illustrates a switched capacitor divider circuitry in a digital linear VR mode, in accordance with some embodiments.

FIG. 5 illustrates a switched capacitor divider circuitry 500 (e.g., 204$_0$) with 2:3 divider ratio, in accordance with some embodiments. FIG. 6 illustrates a switched capacitor divider circuitry 600 with 1:2 divider ratio, in accordance with some embodiments. FIG. 7 illustrates a switched capacitor divider circuitry 700 in a digital linear VR mode, in accordance with some embodiments.

In some embodiments, switched capacitor divider circuitries 500 and 600 comprise p-type transistors MP1, MP2, MP3, MP4, MP5 and MP6; n-type transistors MN1, MN2, and MN3, capacitors C1 and C3, internal nodes n1, n2, n3, and n4 coupled as shown. Clock phase $\Phi_{1\#}$ (which is an inverse or complement of Di) controls transistor MP1. Clock phase $\Phi_{2\#}$ (which is an inverse or complement of $\Phi_2$) controls transistor MP2. Clock phase $\Phi_{2\#}$ controls transistor MP3. Clock phase $\Phi_{1\#}$ controls transistor MP4. Output Vout controls transistor MP5 for the 2:3 divider configuration while clock phase $\Phi_{1\#}$ controls for the 1:2 divider configuration. Clock phase $\Phi_{2\#}$ controls transistor MP6. Clock phase $\Phi_1$ controls transistor MN1 for the 2:3 divider configuration while ground controls for the 1:2 divider configuration. Clock phase $\Phi_2$ controls transistor MN2. Node V1 (e.g., ground) controls transistor MN3 for the 2:3 divider configuration while clock phase $\Phi_1$ controls for the 1:2 divider configuration. For the 2:3 divider ratio configuration, transistor MN3 is off. Nodes n1 and n3 are coupled to capacitor C1 while nodes n2 and n4 are coupled to capacitor C2.

Assuming Vin to be 1.8V, in the 2:3 divider ratio configuration, during the first phase of clock, the gate of MP1 is at 1.0V, gate of MP3 is at 1.8V, gate of MP2 is at 1.8V, gate of MP4 is at 0V, gate of MP6 is at 1.2V, gate of MN1 is at 1.0V, gate of MN2 is at 0V, node n1 is at 1.8V, node n2 is at 1.2V, node n3 is at 0.6V and node n4 is at 0.6V. In this case, the output Vout is at 1.2V. These node voltages (on nodes n1, n2, n3, and n4) are illustrative. Actual voltages can be lower when load current is higher, for example.

Assuming Vin to be 1.8V, in the 2:3 divider ratio configuration, during the second phase of clock, the gate of MP1 is at 1.8V, gate of MP3 is at 1.0V, gate of MP2 is at 0V, gate of MP4 is at 1.8V, gate of MP6 is at 0V, gate of MN1 is at 0V, gate of MN2 is at 1.0V, node n1 is at 1.2V, node n2 is at 1.8V, node n3 is at 0V and node n4 is at 1.2V. In this case, the output Vout is at 1.2V.

Switched capacitor divider circuitry 700 comprises the same transistors and capacitors as in circuitry 500 and 600 as indicated by divider 701. Here, gate terminal of transistors MP1 and MP3 are tied to node pBias_a, which is also coupled to transistor MP7 and programmable current source 702. In various embodiments, programmable current source 702 is controllable by FSM 203.

In the SC VR mode, the switch resistance is controlled by turning on and off transistor banks. Circuitry 700 is the power MOS usage in LDO mode, where the switch resistance is controlled based on the programmable bias current 702. A common power MOS switch topology can operate in three different usages with configurations. Higher voltage operation is enabled by lower source-to-gate (Vgs) voltage or source-to-drain (Vds) voltage during the operation of circuitries 500, 600, and 700. When Vin=1.8 V and Vout=1.05 V, for the circuitries 500, 600, and 700, the worst case Vgs or gate-to-drain voltage Vgd is merely 1.1 V, while, for the traditional power switches, the worst case Vgs or Vgd is 1.8 V.

In digital linear VR mode, circuit 700 handles sudden high load as at the exit from a standby mode. During the digital linear VR mode, as illustrated by circuit configuration 700, all the phase drivers are on, and the output voltage is adjusted by modifying the bias current through the phase driver cell. Continuing with the same example, with Vin being 1.8V, for circuit 700, transistors MP1, MP3, and MP7 are biased by pBias_a, gate of transistor MP2 is at 0V, gate of MP4 is at 0V, gate of MP5 is at 1.05V, Vout is at 1.05V, gate of MP6 is at 1.05V, gate of MN1 is at 0.9V, and gate of MN2 is at 0.9V. In the linear VR mode, the transistor gates are not clocked but are fully on, fully off, or biased (e.g., by Pbias_a). In this configuration, transistors MP2 and MP4 are on, transistor MP5 is off, transistor MP6 is off, transistor MN1 is on, transistor MN2 is on, transistor MN3 is on, transistors MP1, MP3, and MP7 are biased.

Figure 8:
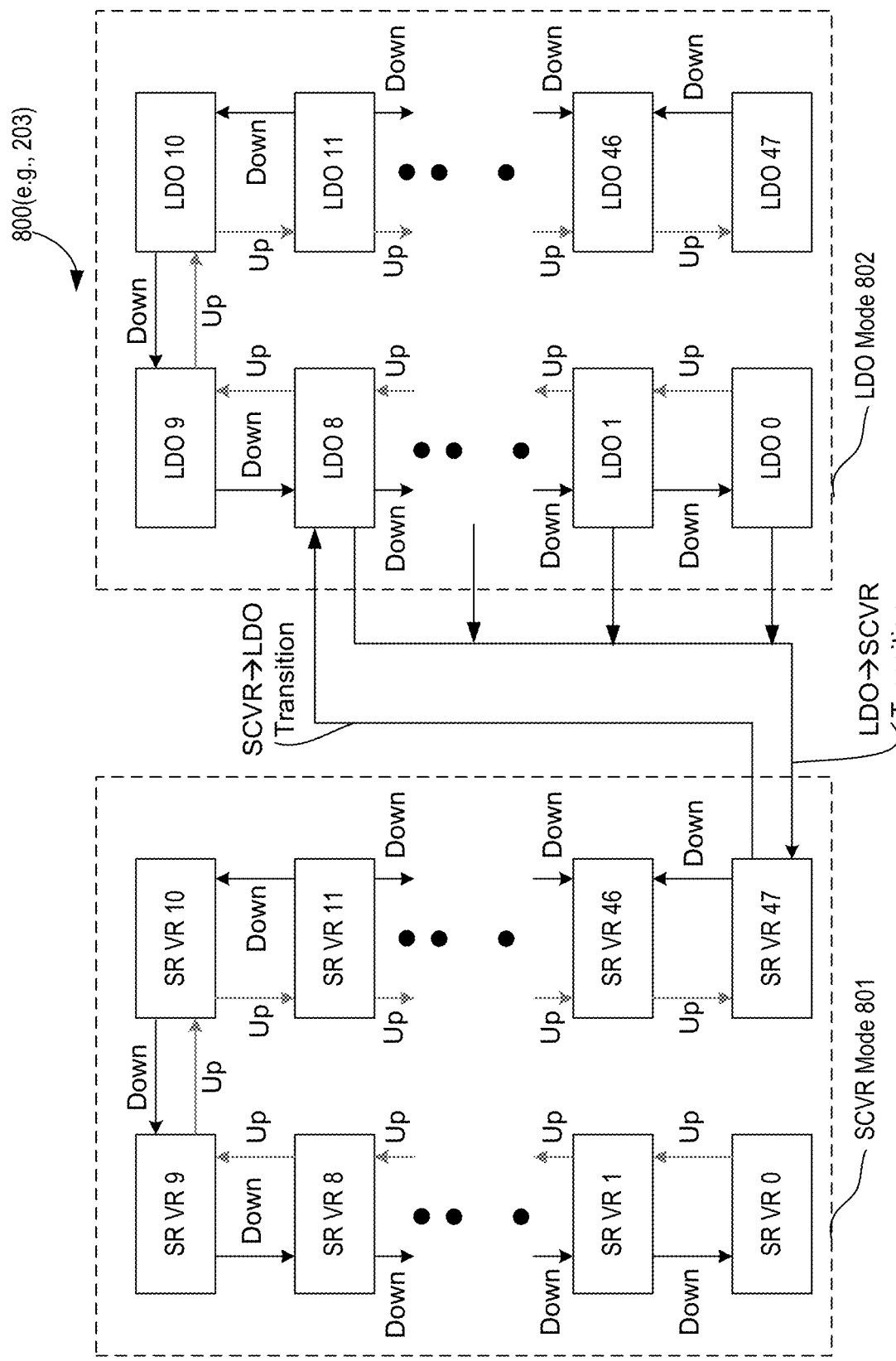
FIG. 8 illustrates a state diagram for the hybrid SCVR digital feedback controller, in accordance with some embodiments.

FIG. 8 illustrates state diagram 800 for the hybrid SCVR digital feedback controller, in accordance with some embodiments. In some embodiments, state diagram 800 is implemented with up/down counter 203 to count from L (e.g., L=0) to P (e.g., P=47), and one bit state to keep track of whether VR is currently in SC VR mode 801 or LDO mode 802. The count in up/down counter 203 indicates the strength of the power MOS switch 204, which is counter-proportional to the switch resistance ($R_{sw}$). In this example, in each of SC VR and LDO mode, 48 different strengths of the power MOS 204 can be specified. If the output of comparator 202 indicates that the strength of power MOS 204 is too low, counter 203 is incremented, or vice versa. This rule applies to both SC VR and LDO mode.

Transition between SC VR mode 801 and LDO mode 802 can happen as follows: If FSM 203 is in the highest state of SC VR mode 801 (e.g., SC VR 47) and comparator 202 indicates to increase the strength of the power MOS 204, FSM 203 transits to LDO 8 state. If FSM 203 is at LDO 8 or a lower state in the LDO mode and comparator 202 indicates to decrease the strength of the power MOS 204, FSM 203 transits to SC VR 47. As predicted, the transition between different modes creates a discontinuity. To avoid the corner case limit-cycling scenario, in some embodiments, hysteresis is added for the transition between SC VR and LDO mode. For example, if SC VR to LDO transition happens, the transition from LDO to SC VR is prohibited for the next H cycles (e.g., H=10).

Figure 9:
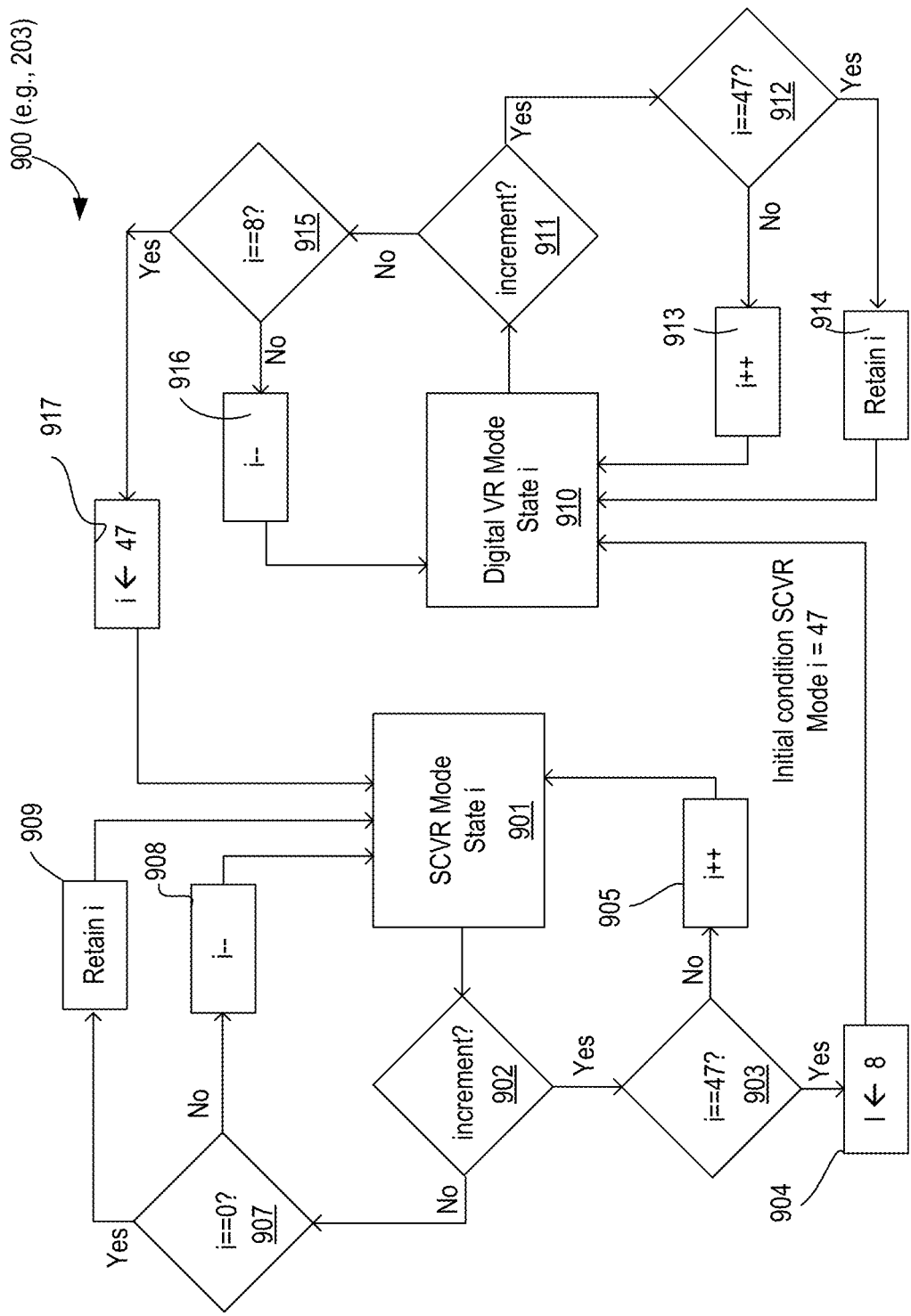
FIG. 9 illustrates another state transition diagram for the digital feedback controller, in accordance with some embodiments.

FIG. 9 illustrates another state transition diagram 900 for the digital feedback controller, in accordance with some embodiments. In various embodiments, there are two different operating modes: SCVR mode 901 (same as 801), and digital linear VR mode 910 (same as 802). FSM 203 may start at either states 901 or 910 depending on how FSM 203 is setup. Assuming for sake of explaining diagram 900 that FSM 203 is in SCVR mode 901 in the beginning.

Controller 203 operates in SCVR mode 901 when the load current is below a threshold (e.g., about 100 mA), while it operates in digital VR mode 910 when the load current is higher than the threshold (e.g., about 100 mA). Controller 203 selects the mode of operations automatically based on the load current and the context of the operation. One role of digital feedback controller 203 is to identify the target driver resistance value based on the comparator output values and the context of the operation of VR, and send that information to phase driver 204, such that phase driver 204 can create a desired IR drop, and that the output voltage Vout is converged to the target.

Figure 10:
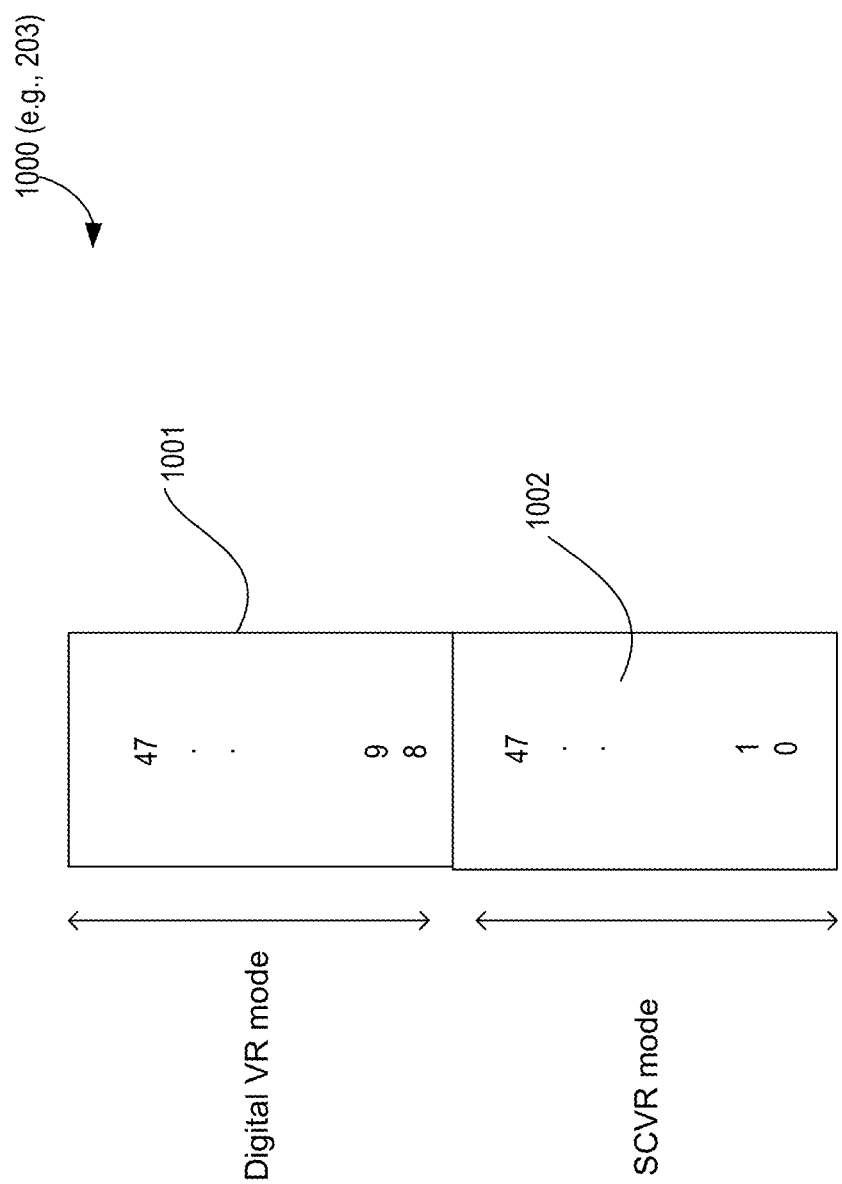
FIG. 10 illustrates a high-level view of the feedback controller functionality, in accordance with some embodiments.

In SCVR mode 901, VR functions as a switched capacitor voltage regulator. The voltage divider ratio is 2-to-1, and 3-to-2. A configuration register, operating system, fuse, etc. sets that. In some embodiments, the VR has a mechanism to create an intentional IR drop, so that the output voltage Vout is converged to the target. In this example, digital feedback controller 203 comprises 6-bit up/down counter to control the IR drop by changing the effective size (and hence resistance) of phase driver 204. The valid counter states are the integer numbers between 0 and 47, each of which indicates the effective size of the phase drivers 204047. FIG. 10 illustrates a high-level view 1000 of the feedback controller functionality, in accordance with some embodiments. View 1000 illustrates the counter values for digital VR mode 1001 (902) and SCVR mode 1002 (901).

Referring back to FIG. 9, at block 902 a determination is made about the value of counter 203. If the load current is below a threshold (e.g., about 100 mA), then the process proceeds to block 902 where it is determined whether the counter value is below its maximum value (e.g., 47) or is above its minimum count value (e.g., 0). Based on whether Vout, divided version Vfeedback, and Vref, the output of comparator 202 determines whether counter 203 should count up or down.

If at block 902, the output of comparator 202 indicates that the counter value should increase, then at block 903 it is determined whether the counter value is still not 47 (e.g., it is less than its maximum value). If the counter value is not at its maximum value (e.g., 47) then counter value 'i' is incremented by 1 at block 905, and the process returns back to SCVR mode 901. If the counter value is at its maximum value, then the counter value is set at some stable level (e.g., value 8) at block 904, and the VR mode changes to digital VR mode 910.

If at block 902, the output of comparator 202 indicates that the counter value should decrease, then at block 907 it is determined whether the counter value is still not at its minimum value (e.g., 0). If the counter value is not its minimum value (e.g., 0) then counter value 'i' is decremented by 1 at block 908, and the process returns back to SCVR mode 901. If the counter value is at its minimum value, then the counter value is retained at that minimum value (e.g., value 0) at block 909, and the process proceeds back to block 901.

At block 910, a similar process as for SCVR mode is repeated for the digital VR mode. In Digital VR mode 910, the SCVR operates as a regular digital linear VR. One motivation of this operational mode is because the maximum load current that can be delivered by SCVR mode 901 is limited by the size of the capacitors (e.g., fly capacitors). Once the load current is over the limit of the SCVR mode 901, then the operational mode is transited to the digital VR mode 910. The operation of the digital VR mode is to control the bias current to create an intentional IR drop through phase driver 204, so that VFeedback (divided Vout) of VR is converged to target voltage Vref, or the output voltage of VR is converged to target, according to FIG. 2. Being in digital VR mode 910 means that the load current is now above the threshold (e.g., about 100 mA).

Unlike SCVR mode 901, the intentional IR drop in the digital VR mode 910 is the voltage drop from the input voltage (e.g., 1.8 V) directly to the output voltage Vout. The control in the digital VR mode is similar to that for SCVR mode 901. In this example, the valid counter states are the integer numbers between 8 and 47, as shown in FIG. 10. Unlike SCVR mode 901, the size of phase driver 204 is fixed during the digital VR mode, but the bias generation circuit controls the level of the current through the switches, which changes the effective driver resistance and the IR drop, and as a result, output voltage Vout. Digital feedback controller 203 receives the signals from the primary comparator, and decides to increment or decrement the counter values. If the comparator value indicates that the VR output voltage should be lower, then it decrements counter 203 to increase the phase driver resistance, which increases the IR drop, and as a result, the output voltage is reduced, or vice versa. Eventually, the output voltage is converged to the target voltage.

If at block 911, the output of comparator 202 indicates that the counter value should increase ease, then at block 912 it is determined whether the counter value is still not 47 (e.g., it is less than its maximum value). If the counter value is not its maximum value (e.g., 47) then counter value 'i' is incremented by 1 at block 913, and the process returns back to linear VR mode 910. If the counter value is at its maximum value, then the counter value is retained at that maximum value (e.g., value 47) at block 914, and the process proceeds back to block 901.

If at block 911, the output of comparator 202 indicates that the counter value should decrease, then at block 907 it is determined whether the counter value is still not its minimum value (e.g., 8). If the counter value is not its minimum value (e.g., 8) for the linear VR mode, then counter value 'i' is decremented by 1 at block 916, and the process returns back to digital VR mode 910. If the counter value is at its maximum value (e.g., 8), then the counter value is set at some stable level (e.g., value 47) at block 917, and the VR mode changes to SCVR mode 901. For example, if the counter value is at the minimum value (e.g., 8) and still the comparator output indicates that the counter value should be decremented, FSM 203 transits to the SCVR mode 901 to decrease the driving strength, further.

In some embodiments, the number of increment or decrement of the up/down counter 203 is 1 by default, but it can be more than 1, and it is determined based on the values of the auxiliary comparators output. If the auxiliary comparator detects that the output voltage is lower than the target and the delta between the output voltage and the target is more than a certain threshold (e.g., default=50 mV), then instead of incrementing 1, it increments the higher number (e.g., +4 or +8, depending on the configuration). Primary comparator makes a decision based on the weighted sum of the voltage comparison, differentiation, and the averaging (or integration) terms. Auxiliary comparator makes a decision based on the voltage comparison (VFeedback (divided Vout) compared with Vref according to FIG. 2). Auxiliary comparator is physically just a conventional comparator, in accordance with various embodiments. Auxiliary comparators are used to detect the condition where the output voltage deviates from the target by more than 50 mV (or certain predetermined or programmable threshold).

In the same manner, if the auxiliary comparator detects that the output voltage is higher than the target and the delta between the output voltage and the target is more than a certain threshold (e.g., default=50 mV), then instead of decrementing 1, it decrements the higher number (e.g., −4 or −8, depending on the configuration). This operation is referred to as the boost operation. The role of the boost operation is to improve the recovery time of the output voltage of VR, in accordance with various embodiments.

Figure 11:
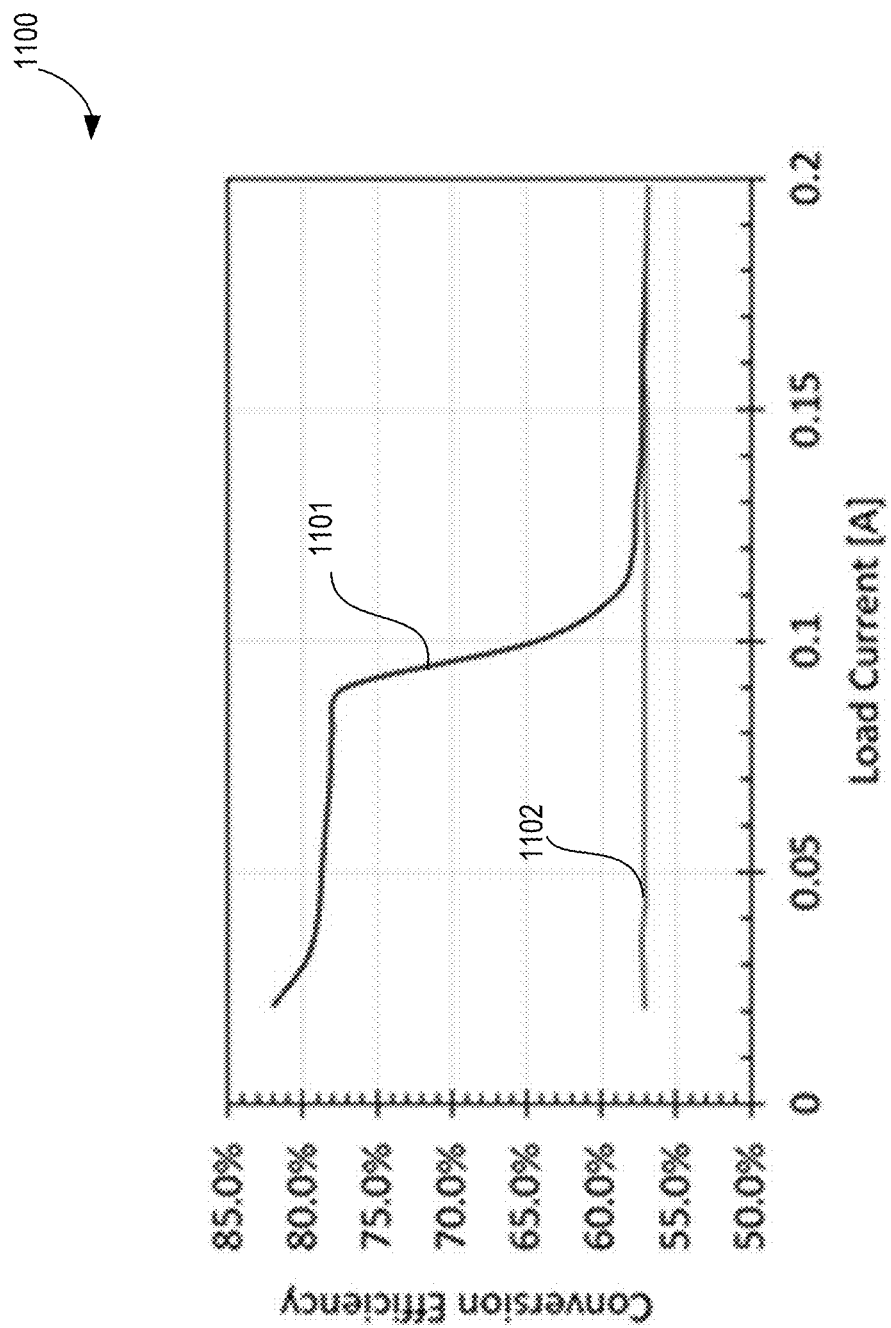
FIG. 11 illustrates a plot showing conversion efficiency of the hybrid SCVR vs. traditional linear VR, in accordance with some embodiments.

FIG. 11 illustrates plot 1100 showing conversion efficiency of the hybrid SCVR vs. traditional linear VR, in accordance with some embodiments. In this example, the voltage conversion is from 1.8 V Vin to 1.02 V Vout. The hybrid SCVR (as indicated by waveform 1101) of various embodiments achieves substantially better efficiency for the low load current (e.g., less than 0.1 A) than the traditional LVR solution 1102. The SCVR of various embodiments achieves over 80% of the conversion efficiency for a low load current condition. For high load current over 80 to about 90 mA, the efficiency goes down, where VR operates in the digital linear regulator mode. In the digital linear regulator mode, the conversion efficiency is as good as that for the traditional LVR (as indicated by waveform 1102). Based on the usage model of the invented VR solution, hybrid SCVR is used for the connected standby mode of SOC, and during that condition, the probability of the high load condition is very low. As a result, even if the efficiency is not great in high load current condition, the impact to the overall efficiency in the stand-by mode is not significant. Still, the digital linear regulator mode is used to handle the sudden high load current, such as the exit from the standby mode, etc., though that condition may not happen very often.

In some embodiments, the transition point from SCVR mode to Digital LVR mode depends on the total size of the fly capacitors. By increasing the size of the fly capacitors, the SCVR mode operation can be extended towards higher load current, and the efficiency for higher load current can be increased, in accordance with some embodiments.

Figure 12:
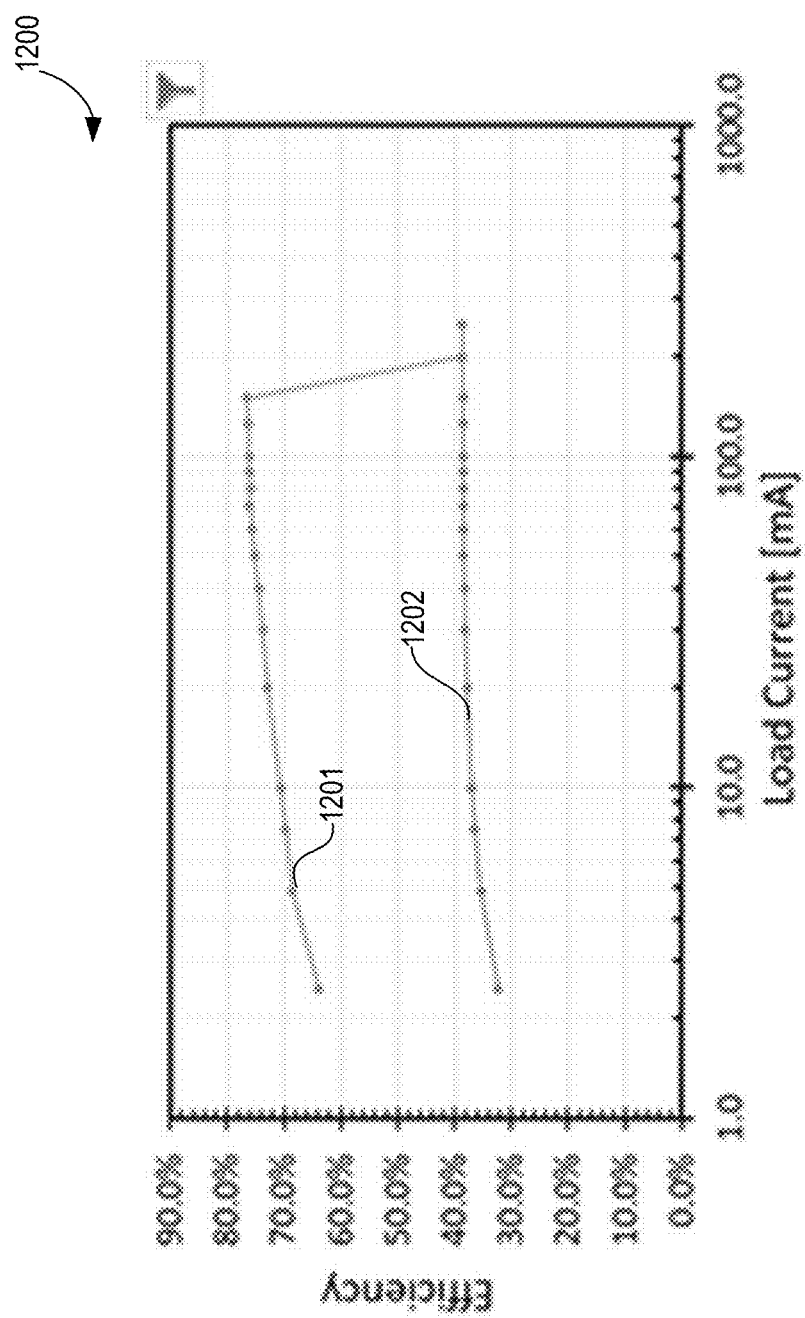
FIG. 12 illustrates a plot showing conversion efficiency of the hybrid SCVR vs. traditional linear VR for 1.8V to 0.7V conversion, in accordance with some embodiments.

FIG. 12 illustrates plot 1200 showing conversion efficiency of the hybrid SCVR (waveform 1201) vs. traditional linear VR (waveform 1202) for 1.8V to 0.7V conversion, in accordance with some embodiments. Plot 1200 shows the projected efficiency for the voltage conversion from 1.8 V to 0.7 V for the SCVR of various embodiments vs. the traditional linear voltage regulator (LVR) solution. For a higher conversion ratio, the hybrid SCVR has even more advantage than the traditional LVR solution. For example, at the load current of 20 mA, the hybrid SCVR achieves a conversion efficiency of 73%, while that for LVR is merely 38%. The corresponding power saving is about 17 mW using hybrid SCVR, in this example.

Figure 13:
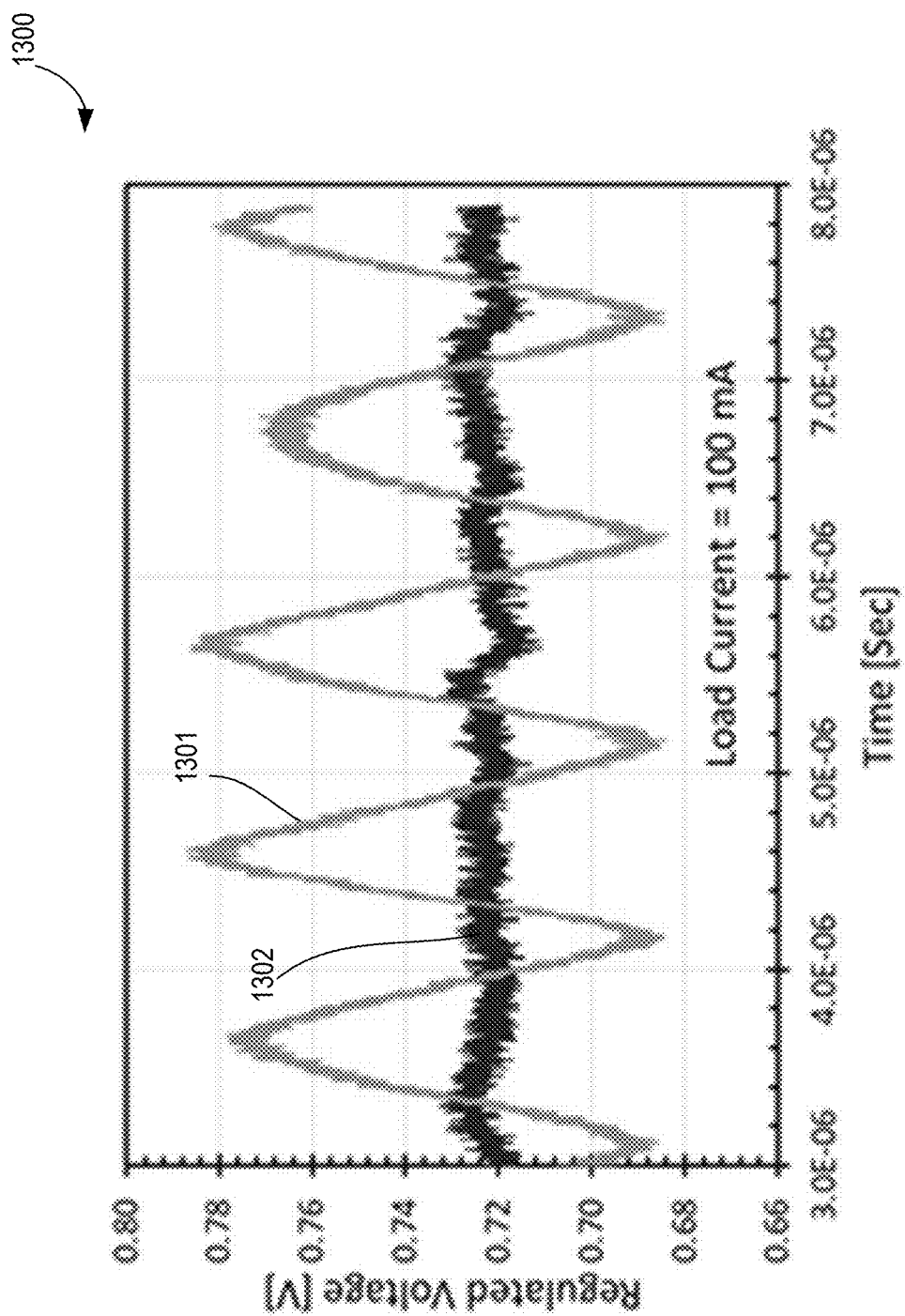
FIG. 13 illustrates a plot showing regulated voltage when the differentiator of various embodiments is turned on and off, respectively, in accordance with some embodiments.

FIG. 13 illustrates plot 1300 showing regulated voltage when the differentiator of various embodiments is turned off (waveform 1301) and on (waveform 1302), respectively, in accordance with some embodiments. Plot 1300 shows the waveform of the output voltage of VR on silicon that is captured by an oscilloscope. It contains two waveforms 1301 and 1302, one with the differentiator enabled (waveform 1302) and the other with the differentiator disabled (waveform 1301). The voltage regulator feedback system has two poles, and the primary pole is the output Vout of the voltage regulator, and the secondary pole is in controller 203. For a light load current, the primary pole location is in low enough frequency, and it is apart enough from the secondary pole. For the high load current, the primary pole moves towards the higher frequency, and gets closer to the secondary pole, which may cause stability issue in the feedback loop. As shown in FIG. 13, digital PDA controller 203 works very effectively to maintain the stability by injecting the zero between two poles.

Figure 14:
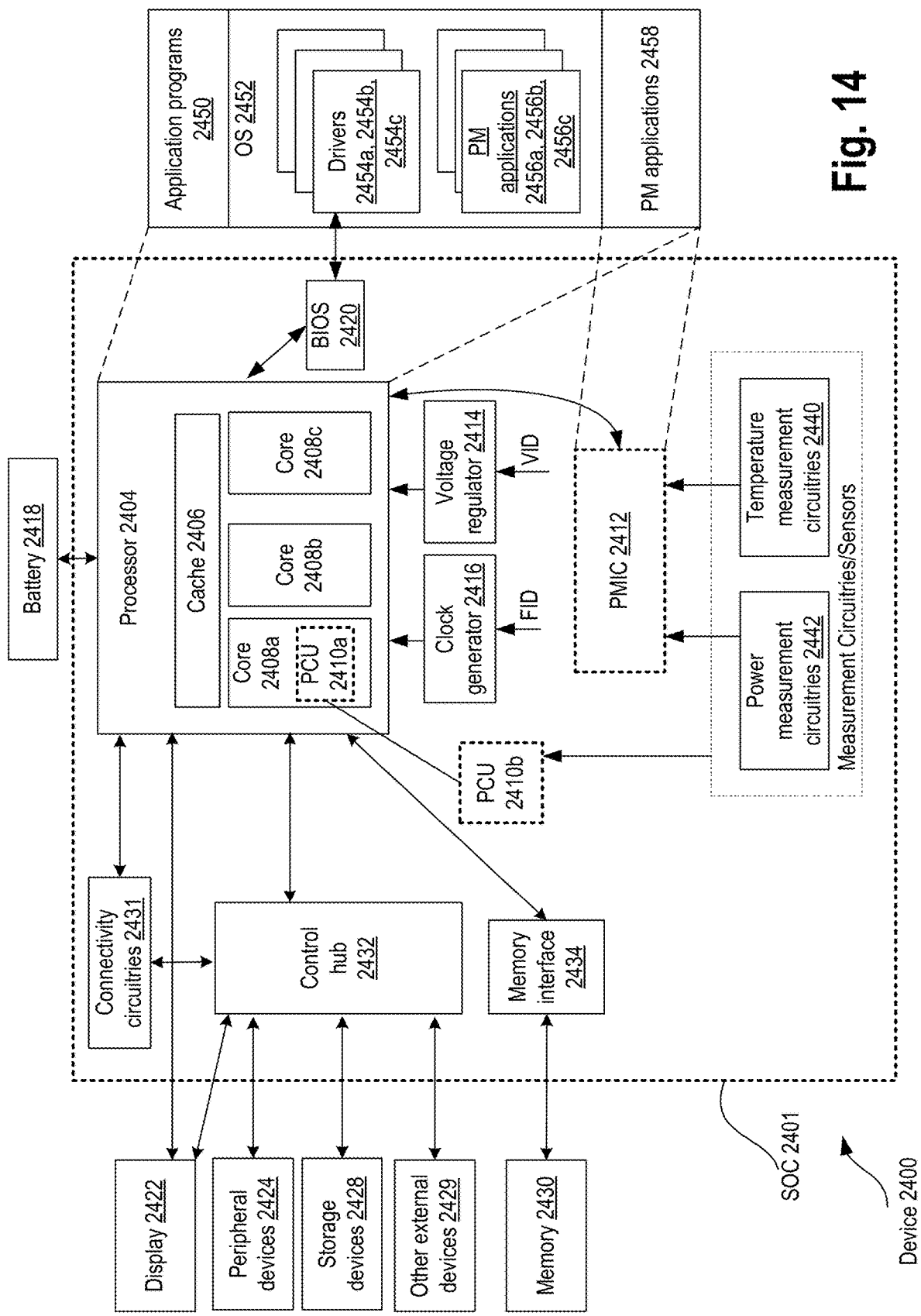
FIG. 14 illustrates a smart device, or a computer system, or a SoC (System-on-Chip) with the hybrid SCVR, according to some embodiments of the disclosure.

FIG. 14 illustrates a smart device, or a computer system, or a SoC (System-on-Chip) with the hybrid SCVR, according to some embodiments of the disclosure. Any block in the SoC discussed here can include the SCVR of various embodiments.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 15, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 15, the processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2404 may also include a bus unit to enable communication between components of the processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414 such as SCVR. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2410a/b and/or PMIC 2412. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals. Clock generator 2416 is an adaptive clock source that can provide an adaptive frequency output as discussed with reference to various embodiments.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 (e.g., SCVR) and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: An apparatus comprising: a plurality of switch capacitor drivers coupled to an input supply node and an output supply node, where in the output supply node is to provide an output voltage to one or more loads; a comparator to receive at least three inputs including: a version of an output voltage, the output voltage, and a reference voltage; and a controller coupled to the comparator, wherein the controller is to receive an output of the comparator and to generate a digital code to enable or disable one or more switch capacitor phase drivers of the plurality of switch capacitor phase drivers.

Example 2: The apparatus of example 1, wherein the comparator comprises: a first circuitry to differentiate the output voltage and to generate a first output indicative of a differentiation; a second circuitry to average the version of an output voltage and to generate a second output indicative of the average; and a third circuitry to compare the version of an output voltage with the reference voltage, and to generate a third output indicative of the comparison.

Example 3: The apparatus of example 2, wherein the comparator comprises a node to sum weighted versions of the first, second, and third outputs to generate a fourth output.

Example 4: The apparatus of example 3, wherein the comparator comprises a clocked comparator to receive the fourth output and to generate the output of the comparator.

Example 5: The apparatus of example 1, wherein an individual switch capacitor driver of the plurality of switch capacitor drivers comprises: at least two capacitors; and a plurality of transistors some of which are coupled to the at least two capacitors, wherein the plurality of transistors are controllable by two different phases of a clock.

Example 6: The apparatus of example 5, wherein the at least two capacitors are MIM capacitors.

Example 7: The apparatus of example 1, wherein an individual switch capacitor driver of the plurality of switch capacitor drivers can operate as one of: 2:3 divider or 1:2 divider.

Example 8: The apparatus of example 1, wherein the comparator is a proportional-differential-averaging (PDA) comparator.

Example 9: The apparatus of example 1 comprises a digital-to-analog (DAC) converter to generate the reference voltage in accordance with a bandgap reference and a digital code.

Example 10: The apparatus of example 1 comprise a voltage divider coupled to the output supply node to generate the version of the output voltage.

Example 11: The apparatus of example 1, wherein the controller comprises an up/down counter.

Example 12: The apparatus of example 1, wherein the controller is to generate the digital code to cause the one or more switch capacitor phase drivers of the plurality of switch capacitor phase drivers to operate in a switch capacitor regulation mode or linear regulation mode in accordance with current demand by the one or more loads.

Example 13: The apparatus of example 12, wherein the switch capacitor regulation mode occurs if the current demand by the one or more loads is less than a threshold.

Example 14: The apparatus of example 13, wherein the linear regulation mode occurs if the current demand by the one or more loads is greater than the threshold.

Example 15: The apparatus of example 13, wherein the threshold is about 100 milli-amperes.

Example 16: An apparatus comprising: a plurality of switch capacitor drivers coupled to an input supply node and an output supply node, where in the output supply node is to provide an output voltage to one or more loads; and a controller coupled to the plurality of switch capacitor drivers and to cause the plurality of switch capacitor phase drivers to operate in a switch capacitor regulation mode or linear regulation mode in accordance with current demand by the one or more loads.

Example 17: The apparatus of example 16, comprises a comparator coupled to the controller, wherein the comparator is to receive at least three inputs including: a version of an output voltage, the output voltage, and a reference voltage.

Example 18: The apparatus of example 17, wherein the controller is to receive an output of the comparator and to generate a digital code to enable or disable one or more switch capacitor phase drivers of the plurality of switch capacitor phase drivers, and wherein the comparator comprises: a first circuitry to differentiate the output voltage and to generate a first output indicative of a differentiation; a second circuitry to average the version of an output voltage and to generate a second output indicative of the average; and a third circuitry to compare the version of an output voltage with the reference voltage, and to generate a third output indicative of the comparison.

Example 19: A system comprising: a memory; a processor core coupled to the memory; a voltage regulator coupled to the processor core, wherein the voltage regulator comprises: a plurality of switch capacitor drivers coupled to an input supply node and an output supply node, where in the output supply node is to provide an output voltage to the processor core; and a controller coupled to the plurality of switch capacitor drivers and to cause the plurality of switch capacitor phase drivers to operate in a switch capacitor regulation mode or linear regulation mode in accordance with current demand by the processor core; and a wireless interface to allow the processor core to communicate with another device.

Example 20: The system of example 19, wherein the voltage regulator comprises a comparator coupled to the controller, wherein the comparator is to receive at least three inputs including: a version of an output voltage, the output voltage, and a reference voltage.

Example 21: The system of example 20, wherein the controller is to receive an output of the comparator and to generate a digital code to enable or disable one or more switch capacitor phase drivers of the plurality of switch capacitor phase drivers, and wherein the comparator comprises: a first circuitry to differentiate the output voltage and to generate a first output indicative of a differentiation; a second circuitry to average the version of an output voltage and to generate a second output indicative of the average; and a third circuitry to compare the version of an output voltage with the reference voltage, and to generate a third output indicative of the comparison.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a plurality of switch capacitor phase drivers coupled to an input supply node and an output supply node, where in the output supply node is to provide an output voltage to one or more loads;
   a comparator to receive at least three inputs including: a version of the output voltage, the output voltage, and a reference voltage; and
   a controller coupled to the comparator, wherein the controller is to receive an output of the comparator and to generate a digital code to enable or disable one or more switch capacitor phase drivers of the plurality of switch capacitor phase drivers.

2. The apparatus of claim 1, wherein the comparator comprises:
   a first circuitry to differentiate the output voltage and to generate a first output indicative of a differentiation;
   a second circuitry to average the version of the output voltage and to generate a second output indicative of the average; and
   a third circuitry to compare the version of the output voltage with the reference voltage, and to generate a third output indicative of the comparison.

3. The apparatus of claim 2, wherein the comparator comprises a node to sum weighted versions of the first, second, and third outputs to generate a fourth output.

4. The apparatus of claim 3, wherein the comparator comprises a clocked comparator to receive the fourth output and to generate the output of the comparator.

5. The apparatus of claim 1, wherein an individual switch capacitor phase driver of the plurality of switch capacitor phase drivers comprises:
   at least two capacitors; and
   a plurality of transistors some of which are coupled to the at least two capacitors, wherein the plurality of transistors are controllable by two different phases of a clock.

6. The apparatus of claim 5, wherein the at least two capacitors are metal-insulator-metal (MIM) capacitors.

7. The apparatus of claim 1, wherein an individual switch capacitor phase driver of the plurality of switch capacitor phase drivers can operate as one of: 2:3 divider or 1:2 divider.

8. The apparatus of claim 1, wherein the comparator is a proportional-differential-averaging (PDA) comparator.

9. The apparatus of claim 1 comprises a digital-to-analog (DAC) converter to generate the reference voltage in accordance with a bandgap reference and a digital code.

10. The apparatus of claim 1 comprise a voltage divider coupled to the output supply node to generate the version of the output voltage.

11. The apparatus of claim 1, wherein the controller comprises an up/down counter.

12. The apparatus of claim 1, wherein the controller is to generate the digital code to cause the one or more switch capacitor phase drivers of the plurality of switch capacitor phase drivers to operate in a switch capacitor regulation mode or linear regulation mode in accordance with current demand by the one or more loads.

13. The apparatus of claim 12, wherein the switch capacitor regulation mode occurs if the current demand by the one or more loads is less than a threshold.

14. The apparatus of claim 13, wherein the linear regulation mode occurs if the current demand by the one or more loads is greater than the threshold.

15. The apparatus of claim 13, wherein the threshold is about 100 milli-amperes.

* * * * *